(12) United States Patent
Huang

(10) Patent No.: US 10,468,082 B1
(45) Date of Patent: Nov. 5, 2019

(54) MRAM SENSE AMPLIFIER HAVING A PRE-AMPLIFIER WITH IMPROVED OUTPUT OFFSET CANCELLATION

(71) Applicant: GLOBALFOUNDRIES, Inc., Grand Cayman (KY)

(72) Inventor: Yentsai Huang, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/140,417

(22) Filed: Sep. 24, 2018

(51) Int. Cl.
*G11C 11/00* (2006.01)
*G11C 11/16* (2006.01)
*H01L 27/22* (2006.01)
*H01L 43/02* (2006.01)
*H01L 43/08* (2006.01)

(52) U.S. Cl.
CPC ........ *G11C 11/1673* (2013.01); *H01L 27/228* (2013.01); *H01L 43/02* (2013.01); *H01L 43/08* (2013.01)

(58) Field of Classification Search
CPC ..... G11C 16/28; G11C 16/26; G11C 11/1673; G11C 11/16
See application file for complete search history.

(56) References Cited

U.S. PATENT DOCUMENTS

| 2014/0153313 | A1* | 6/2014 | Boujamaa | G11C 7/14 365/148 |
|---|---|---|---|---|
| 2015/0294706 | A1 | 10/2015 | Bonaccio et al. | |
| 2018/0075914 | A1* | 3/2018 | Sheng | G11C 16/28 |
| 2018/0294017 | A1* | 10/2018 | Chen | G11C 29/021 |

OTHER PUBLICATIONS

Atasoyu et al., "Spin-Torque Memristor Based Offset Cancellation Technique for Sense Amplifiers", Istanbul Technical University, 4 pages.
Hong et al., "Low-Voltage DRAM Sensing Scheme With Offset-Cancellation Sense Amplifier", IEEE Journal of Solid-State Circuits, Oct. 2002, pp. 1356-1360, vol. 37, No. 10.
(Continued)

*Primary Examiner* — Uyen B Tran
(74) *Attorney, Agent, or Firm* — Yee Tze Lim; Hoffman Warnick LLC

(57) ABSTRACT

A magnetic random access memory (MRAM) sense amplifier circuit is provided that includes a pre-amplifier circuit that includes a data leg, a reference leg, and an operational amplifier. The data leg includes a first P-channel transistor and a first N-channel transistor that receives a local data bit bias voltage and outputs a data branch output voltage. The reference leg includes a second P-channel transistor and a second N-channel transistor. The transistors of the reference leg mismatch the transistors of the data leg due to device variations. The second N-channel transistor receives a global reference bit bias voltage, and outputs a reference voltage. The operational amplifier determines the difference between the data branch output voltage and the reference voltage, and generates an adjusted local data bit bias voltage that matches the global reference bit bias voltage to offset the mismatches that exist between the data leg and the reference leg.

20 Claims, 3 Drawing Sheets

(56) References Cited

OTHER PUBLICATIONS

Kang et al., "A Sense Amplifier Scheme with Offset Cancellation for Giga-bit DRAM", Journal of Semiconductor Technology and Science, Jun. 2007, pp. 67-75, vol. 7, No. 2.

Lee et al., "STT-MRAM Read-Circut with Improved Offset Cancellation", Journal of Semiconductor Technology and Science, Jun. 2017, pp. 347-353, vol. 17, No. 3.

Song et al., "Latch Offset Cancellation Sense Amplifier for Deep Submicrometer STT-RAM", IEEE Transactions on Circuits and Systems_I: Regular Papers, Jul. 2015, pp. 1776-1784, vol. 62, No. 7.

* cited by examiner

MRAM SENSE AMPLIFIER HAVING A PRE-AMPLIFIER WITH IMPROVED OUTPUT OFFSET CANCELLATION

TECHNICAL FIELD

Embodiments of the subject matter described herein relate generally to sense amplifiers that are used for sensing low voltage signals of a magnetic random access memory (MRAM). More particularly, embodiments of the subject matter relate an MRAM sense amplifier having a pre-amplifier with improved output offset cancellation.

BACKGROUND

MRAM is an emerging memory technology, that offer non-volatility, high performance and high endurance. A typical MRAM memory cell includes a magnetic tunnel junction (MTJ) in series with a field effect transistor (FET), which is gated by a word line (WL). A bit line (BL) and a source line (SL) run parallel to each other and perpendicular to the WL. The BL is connected to the MTJ, and the SL is connected to the FET. One memory cell along the BL is selected by turning on its WL. When a relatively large voltage (e.g., 500 mV) is forced across the cell from BL to SL, the selected cell's MTJ is written into a particular state, which is determined by the polarity of this voltage.

When the cell is in a logic "0" or parallel state, its MTJ resistance is lower than when the cell is in a logic "1" or anti-parallel state. A selected cell is read by sensing the resistance from BL to SL. The "sense" or "read" voltage must be much lower than the write voltage in order to clearly distinguish write and read operations, and to avoid inadvertently disturbing the cell during a read operation. Thus, there is a need for sense amplifier (SA) designs capable of sensing very low read voltages (e.g., less than 50 mV).

However, random device variations (e.g., dimensions and other parameters) can lead to an effect, known generally as FET mismatch, which results in random offsets in various circuits, such as pre-amplifiers or other circuits that include FET configurations. To address such offsets, offset-cancellation techniques can be used to minimize the effects of FET mismatch. In a typical offset-cancellation technique applied to an amplifier circuit, during a first phase the amplifier offset is determined and stored on one or more capacitors. The circuit is then re-configured, and during the second phase the capacitors act to cancel out the amplifier offset, ideally resulting in zero offset. In reality, some offset still remains but has been significantly reduced.

In addition, another issue that arises in pre-amplifiers is reference resistance drift. The pre-amplifier compares resistance of a data branch and a reference branch. These resistances include the resistance of MRAM cell (MTJ cell and its FET), and the FETs (P2, N2, and P1, N1) that make up the data branch and the reference branch. Any mismatch between these two resistances will cause the point used to determine logic 0 and 1 to drift.

Accordingly, it is desirable to provide improved MRAM sensing techniques that can reduce the impact of random device variations. It would also be desirable if such MRAM sensing techniques could allow for the size of transistors used in the MRAM sense amplifier to be reduced and/or minimized because larger transistors slow down sensing speed. Furthermore, other desirable features and characteristics of the present invention will become apparent from the subsequent detailed description of the invention and the appended claims, taken in conjunction with the accompanying drawings and this background of the invention.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY OF EMBODIMENTS

In accordance with some of the disclosed embodiments, a circuit is provided that includes a memory cell comprising a magnetic tunnel junction (MTJ) cell, and a magnetic random access memory (MRAM) sense amplifier circuit. The MRAM sense amplifier circuit includes a pre-amplifier circuit, and a differential comparator.

The pre-amplifier circuit includes a data leg configured to receive a local data bit bias voltage and to output a data branch output voltage; a reference leg configured to receive a global reference bit bias voltage and to output a reference voltage; and an operational amplifier. In one embodiment, the data leg comprises: a first P-channel transistor, and a first N-channel transistor configured to receive a local data bit bias voltage and to output a data branch output voltage. The reference leg comprises a second P-channel transistor that mismatches the first P-channel transistor due to device variations, and a second N-channel transistor that mismatches the first N-channel transistor due to device variations. The second N-channel transistor is configured to receive a global reference bit bias voltage, and the second P-channel transistor is configured to output a reference voltage. The mismatches between the data leg and the reference leg normally result in a non-zero offset voltage between the local data bit bias voltage and the global reference bit bias voltage prior to calibration.

In one embodiment, the first P-channel transistor comprises: a source that is coupled to a supply voltage, a gate, and a drain that is configured to receive the data branch output voltage; the first N-channel transistor comprises: a source, a gate that is configured to receive the adjusted local data bit bias voltage output by the operational amplifier, and a drain; the second P-channel transistor comprises: a source that is coupled to the supply voltage, a gate that is coupled to the gate of first P-channel transistor and configured to receive the reference voltage, and a drain that is configured to receive the reference voltage; and the second N-channel transistor comprises: a source that is configured to receive the reference voltage, a gate that is configured to receive the global reference bit bias voltage, and a drain.

The operational amplifier allows for calibration (e.g., during a calibration cycle) of the pre-amplifier before sensing the memory cell (e.g., during a sensing cycle that occurs after the calibration cycle). The operational amplifier comprises: a first input configured to receive the reference voltage; a second input configured to receive the data branch output voltage. The operational amplifier is configured to: determine the difference between the data branch output voltage and the reference voltage; and generate and output an adjusted local data bit bias voltage that matches the global reference bit bias voltage to offset mismatches that exist between the data leg and the reference leg. For example, the operational amplifier can adjust the local data bit bias voltage to cancel an offset voltage that otherwise arises between the data branch output voltage and the reference voltage due to the mismatches so that the offset is cancelled before sensing the memory cell (e.g., when the adjusted local data bit bias voltage is applied during a sensing cycle). Applying the adjusted local data bit bias voltage causes the data branch output voltage to be the same as reference voltage even though the adjusted local data bit bias voltage and the global reference bit bias voltage are different from each other.

In one embodiment, the pre-amplifier circuit further comprises a first switch; a first capacitor; a second capacitor; a first reference resistance coupled to ground; a second switch; a third switch; and a second reference resistance. The reference voltage is coupled to a first node, the first switch configured to be coupled between a second node and a third node when closed; the first capacitor is coupled between the third node and ground; the second capacitor is coupled between a fourth node at the output of the operational amplifier and ground; the second switch configured to be coupled between a fifth node and the first reference resistance when closed; the third switch configured to be coupled between the fifth node and the memory cell when closed; and the second reference resistance is coupled between the drain of the second N-channel transistor and ground, and being configured to receive a second reference current (Iref0) from the second N-channel transistor.

During a calibration cycle, the first switch and the second switch are closed, and the third switch is open so that the first capacitor receives and stores the data branch output voltage to maintain the adjusted local data bit bias voltage during a sensing cycle. The data leg is connected to the first reference resistance so that the first reference resistance receives a first reference current output by the first N-channel transistor. The first reference resistance sensed by the data leg is equal to the second reference resistance sensed by the reference leg so that the data branch output voltage output by the data leg will be calibrated with the reference voltage output by the reference leg to cancel the offset before sensing the memory cell. Thus, during the calibration cycle, the operational amplifier can adjust the local data bit bias voltage that is applied to a gate of the first N-channel transistor so that the gate of the first N-channel transistor clamps the voltage biased to first reference resistance and memory cell to cancel the offset between the data branch output voltage and the reference voltage so that data branch output voltage will be the same as reference voltage when the adjusted local data bit bias voltage applied to the first N-channel transistor and the second capacitor. The second capacitor is configured to store the adjusted local data bit bias voltage for a sensing cycle that follows the calibration cycle.

During the sensing cycle, the first switch and the second switch are open and the third switch is closed so that the data leg is coupled to the memory cell at the fifth node to allow a current to flow to the memory cell to read a data bit that is held by the memory cell. The adjusted local data bit bias voltage that is stored by the second capacitor is then used to read the data bit during the sensing cycle. The differential comparator can compare the data branch output voltage to the reference voltage and output a digital signal indicating which is larger.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The connecting lines shown in the various figures contained herein are intended to represent example functional relationships and/or physical couplings between the various elements. It should be noted that many alternative or additional functional relationships or physical connections may be present in an embodiment. As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

Figure 1:
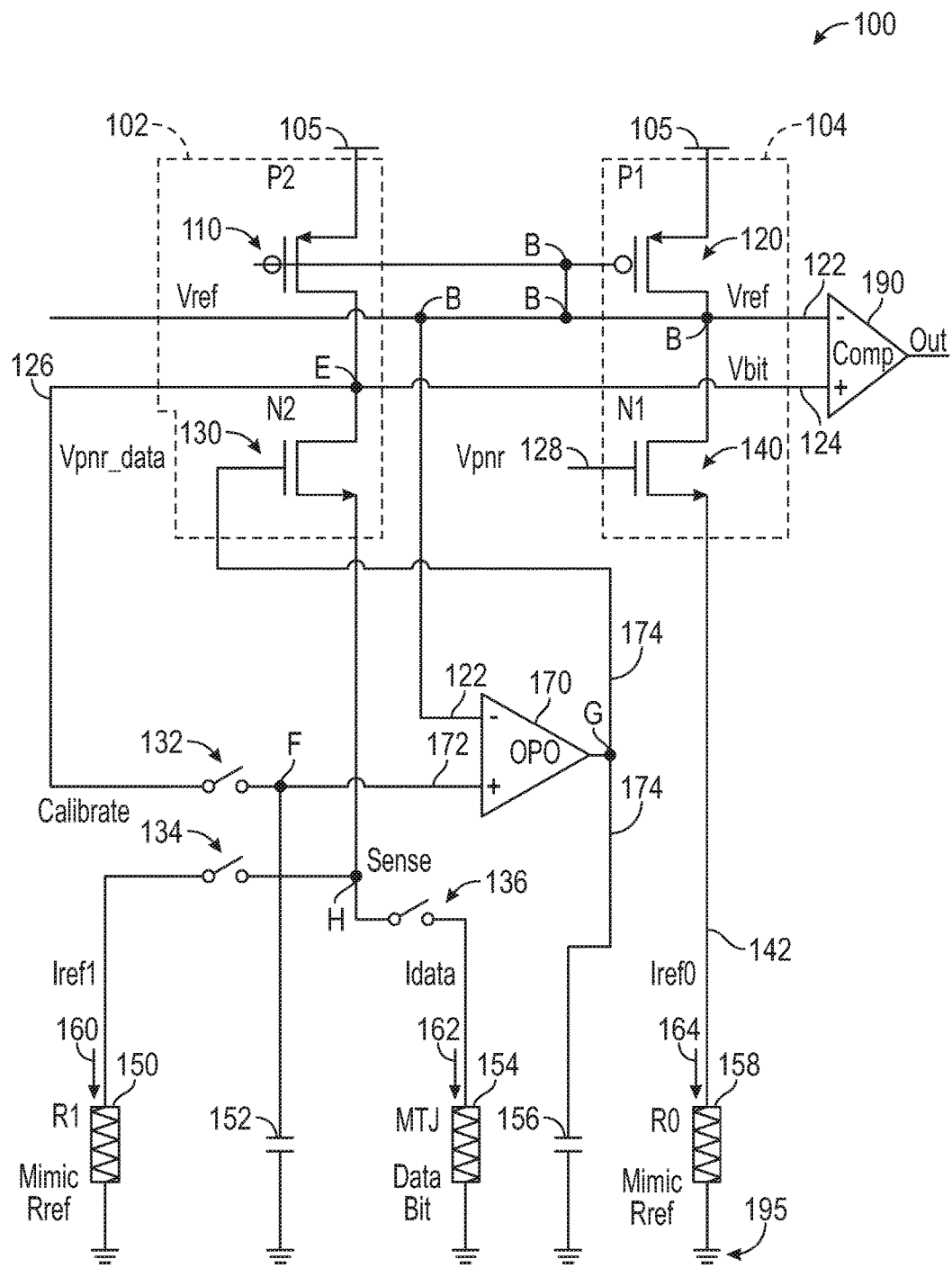
FIG. 1 is a circuit schematic diagram that illustrates an MRAM sense amplifier and a memory cell in accordance with the disclosed embodiments.

FIG. 1 is a circuit schematic diagram that illustrates an MRAM sense amplifier 100 and a memory cell 154 in accordance with the disclosed embodiments. The MRAM sense amplifier 100 includes all of the components shown except the memory cell 154. Nodes B and E-H are labeled on FIG. 1-3 for reference purposes.

The memory cell 154 is one memory cell of an MRAM array and holds the state of one data-bit. As is known in the art, the memory cell 154 is implemented using a magnetic tunnel junction (MTJ) cell in series with a field effect transistor (FET) (not illustrated for sake of simplicity), which is gated by a word line (WL). A bit line (BL) and a source line (SL) run parallel to each other and perpendicular to the WL. The BL is connected to the MTJ, and the SL is connected to the FET. One memory cell along the BL is selected by turning on its WL. When a relatively large voltage is forced across the cell from BL to SL, the selected cell's MTJ is written into a particular state, which is determined by the polarity of this voltage. When the cell is in a logic "0" or parallel state, its MTJ resistance is lower than when the cell is in a logic "1" or anti-parallel state. A selected cell is read by sensing the resistance from BL to SL, which is grounded during the read operation. The "sense" or "read" voltage must be much lower than the write voltage in order to clearly distinguish write and read operations, and to avoid inadvertently disturbing the cell during a read operation. Thus, there is a need for sense amplifier (SA) designs capable of sensing very low read voltage.

The MRAM sense amplifier 100 includes a pre-amplifier (not labeled) and a differential comparator 190. The pre-amplifier includes all of the components in FIG. 1 except the memory cell 154 and the comparator 190. In this embodiment, the pre-amplifier includes a first P-channel MOSFET (P2) 110, a second P-channel MOSFET (P1) 120, a first N-channel MOSFET (N2) 130, a second N-channel MOSFET (N1) 140, an offset-cancellation operational amplifier 170, first switch 132, second switch 134, third switch 136, a first reference resistance 150, a first capacitor 152, a second capacitor 156 and a second reference resistance 158. The first reference resistance 150 and the second reference resistance 158 can be implemented using any know type of resistance and in one embodiment can be implemented using an MTJ cell.

The differential comparator 190 is coupled to the output of the pre-amplifier to digitize a small differential output of the pre-amplifier. The differential comparator 190 configured to compare the data branch output voltage (Vbit) 124 to the reference voltage (Vref) 122 and outputs a digital (binary) signal indicating which one is larger. The comparator can be implemented using a specialized high-gain differential amplifier that determines the difference between the outputs for the pre-amplifier (e.g., difference between data branch output voltage (Vbit) 124 and the reference voltage (Vref) 122) and outputs a signal indicating which one is larger.

Referring again to the pre-amplifier, the first P-channel MOSFET (P2) 110 and the first N-channel MOSFET (N2) 130 make up a data leg 102 of the pre-amplifier. The data leg receives a local data bit bias voltage (Vpnr_data) 174 and outputs a data branch output voltage (Vbit) 124. The second P-channel MOSFET (P1) 120 and the second N-channel MOSFET (N1) 140 make up a reference leg 104 of the pre-amplifier. The reference leg receives a global reference bit bias voltage (Vpnr) 128 and outputs a reference voltage (Vref) 122. Due to device variations (e.g., dimensions and other parameters), there is a mismatch between the first P-channel MOSFET (P2) 110 of the data leg 102 and the second P-channel MOSFET (P1) 120 of the reference leg 104. Likewise, there is a mismatch between the first N-channel MOSFET (N2) 130 of the data leg 102 and the second N-channel MOSFET (N1) 140 of the reference leg 104 also due to random device variations (e.g., dimensions and other parameters). Without calibration techniques that will be described below, the mismatches between the data leg 102 and the reference leg 104 normally result in a non-zero offset voltage between the local data bit bias voltage (Vpnr_data) 174 and the global reference bit bias voltage (Vpnr) 128.

As will be described in greater detail below, the pre-amplifier in accordance with the disclosed embodiments includes an output offset cancellation feature that is used to calibrate for device mismatches (described above) of the pre-amplifier that exist between a reference leg 104 and a data leg 102 to eliminate an offset between a reference voltage (Vref) 122 and a data branch output voltage (Vbit) 124 (that arises due to the device mismatches) before sensing data bits of the memory cell 154. The data leg 102 senses the same resistance resistor 150, 158 with reference leg 104 to cancel output offset before sensing the memory cell 154. When the data leg 102 and the reference leg 104 access the same resistance 150, 158, the data branch output voltage (Vbit) 124 will be calibrated with the reference voltage (Vref) 122, and the reference leg 104 connection to resistance 158 should mimic the data leg 102 connection to resistance 150 and to memory cell 154 as close as possible. The output offset cancellation feature calibrates the data leg 102 with the reference leg 104, then sets an N-follower bias of the data leg 102. During calibration, the data leg 102 outputs same voltage level as the reference leg 104 (e.g., the reference voltage (Vref) 122 from reference leg 104). Then, during a sensing cycle, when the data leg 102 switches to read or access the memory cell 154, and the output of the pre-amplifier (and hence the MRAM sense amplifier 100) is fast with the established operating points. This allows high-speed MRAM read access to be achieved because the sensing devices 110, 120, 130, 140 can be very small, and thus improve the sensing speed, without the consequences from device mismatches and without sacrificing the sensing accuracy. Without applying calibration before sensing, the device mismatch between the data leg 102 and the reference leg 104 would result in sensing inaccuracy. In other words, the output offset cancellation scheme allows for a pre-amplifier to be implemented using ultra-small, mismatched transistor devices 110, 120, 130, 140 that have much less parasitic capacitance, while also speeding up sensing time of the pre-amplifier to achieve a MRAM sense amplifier 100 so that it exhibits faster sensing time. In addition, the diode connection of second P-channel MOSFET (P1) 120 will also settle faster. For instance, in one implementation, when the proposed offset cancellation techniques are applied, the width-length (W/L) ratio of the second P-channel MOSFET (P1) 120 to the first P-channel MOSFET (P2) 110 can be 1 μm/0.1 μm versus 30 μm/2 μm when the proposed offset cancellation techniques are not applied. Similarly, when the proposed offset cancellation techniques are applied, the width-length (W/L) ratio of the second N-channel MOSFET (N1) 140 to the first N-channel MOSFET (N2) 130 can be 1 μm/0.024 μm versus 15 μm/0.3 μm when the proposed offset cancellation techniques are not applied.

A description of the structure of the pre-amplifier and its operation during the calibration and sensing cycles will now be provided.

The first P-channel MOSFET (P2) 110 includes a source terminal (or source) that is coupled to the supply voltage (VDD) 105, a control terminal or gate that is coupled to the node A, and a drain terminal (or drain) that is coupled to node E to receive the data branch output voltage (Vbit) 124. The first N-channel MOSFET (N2) 130 includes a source that is coupled to node E, a gate that is coupled to the node G and configured to receive a local data bit bias voltage (Vpnr_data) 174 output by the offset-cancellation operational amplifier 170, and a drain that is coupled to node H.

The second P-channel MOSFET (P1) 120 includes a source that is coupled to the supply voltage (VDD) 105, a gate that is coupled to the gate of first P-channel MOSFET (P2) 110 which are both configured to receive a reference voltage (Vref) 122 (via node B), and a drain that is coupled to node B to receive the reference voltage (Vref) 122. The second N-channel MOSFET (N1) 140 includes a source that is coupled to node B to receive the reference voltage (Vref) 122, a gate that is configured to receive a global reference bit bias voltage (Vpnr) 128, and a drain that is coupled to the second reference resistance 158. The second reference resistance 158 is also coupled to ground 195 and is configured to receive a second reference current (Iref0) 164 from the second N-channel MOSFET (N1) 140.

The offset-cancellation operational amplifier 170 includes a first, inverting input 171 coupled to node B and configured to receive the reference voltage (Vref) 122, a second, non-inverting input 172 coupled to node F and configured to receive the data branch output voltage (Vbit) 124, and an output coupled to node G. The offset-cancellation operational amplifier 170 determines the difference between the inputs (i.e., reference voltage (Vref) 122 and data branch output voltage (Vbit) 124) and generates an output voltage (Vout) at node G, which will be referred to hereafter as a local data bit bias voltage (Vpnr_data) 174. When a device mismatch exists between the data leg 102 and the reference leg 104, the local data bit bias voltage (Vpnr_data) 174 and the global reference bit bias voltage (Vpnr) 128 are different from each other. The difference between the local data bit bias voltage (Vpnr_data) 174 and the global reference bit bias voltage (Vpnr) 128 is an offset voltage, which is non-zero when a mismatch exists between the data leg 102 and the reference leg 104. As will be explained below, the operational amplifier 170 allows for calibration of the pre-amplifier before sensing the memory cell.

In accordance with the disclosed embodiments, when the local data bit bias voltage (Vpnr_data) 174 and the global reference bit bias voltage (Vpnr) 128 are different from each other, the offset between the data branch output voltage (Vbit) 124 and the reference voltage (Vref) 122 can be cancelled or eliminated when an adjusted local data bit bias voltage (Vpnr_data) 174 is applied such that data branch output voltage (Vbit) 124 will be the same as reference voltage (Vref) 122. The operational amplifier 170 adjusts the local data bit bias voltage (Vpnr_data) 174 to generate an adjusted local data bit bias voltage (Vpnr_data) 174 that matches the global reference bit bias voltage (Vpnr) 128 to offset the device mismatch that exists between the data leg 102 and the reference leg 104. To explain further, the offset-cancellation operational amplifier 170 adjusts the local data bit bias voltage (Vpnr_data) 174, that is applied to the gate of the first N-channel MOSFET (N2) 130, so that the gate clamps the voltage biased to first reference resistance 150 and memory cell 154, and cancels the offset between data branch output voltage (Vbit) 124 and the reference voltage (Vref) 122 during calibration or sampling cycle. In this way, the operational amplifier adjust the local data bit bias voltage (Vpnr_data) 174 to cancel an offset voltage that otherwise arises between the data branch output voltage (Vbit) 124 and the reference voltage (Vref) 122 due to the device mismatch so that the offset is cancelled before sensing the memory cell 154 (e.g., when the adjusted local data bit bias voltage (Vpnr_data) 174 is applied during a sensing cycle). Applying the adjusted local data bit bias voltage (Vpnr_data) 174 causes the data branch output voltage (Vbit) 124 to be the same as reference voltage (Vref) 122 even though the adjusted local data bit bias voltage (Vpnr_data) 174 and the global reference bit bias voltage (Vpnr) 128 are different from each other.

The reference voltage (Vref) 122 is coupled to a node A. The first switch 132 configured to be coupled between a node E and a node F when closed. The second switch 134 is configured to be coupled between a node H and the first reference resistance 150 when closed. The third switch 136 is configured to be coupled between the node H and the memory cell 154 when closed. The second reference resistance 158 is coupled between the drain of the second N-channel transistor (N1) 140 and ground, and also configured to receive a second reference current (Iref0) 164 from the second N-channel transistor (N1) 140.

The first capacitor 152 is coupled between the node F and ground. The first capacitor 152 stores data branch output voltage (Vbit) 124 of calibration cycle for maintaining the calibrated local data bit bias voltage (Vpnr_data) 174 during sensing cycle.

The second capacitor 156 is coupled between a node G at the output of the operational amplifier 170 and ground. The second capacitor 156 is used to store the local data bit bias voltage (Vpnr_data) 174.

Figure 2:
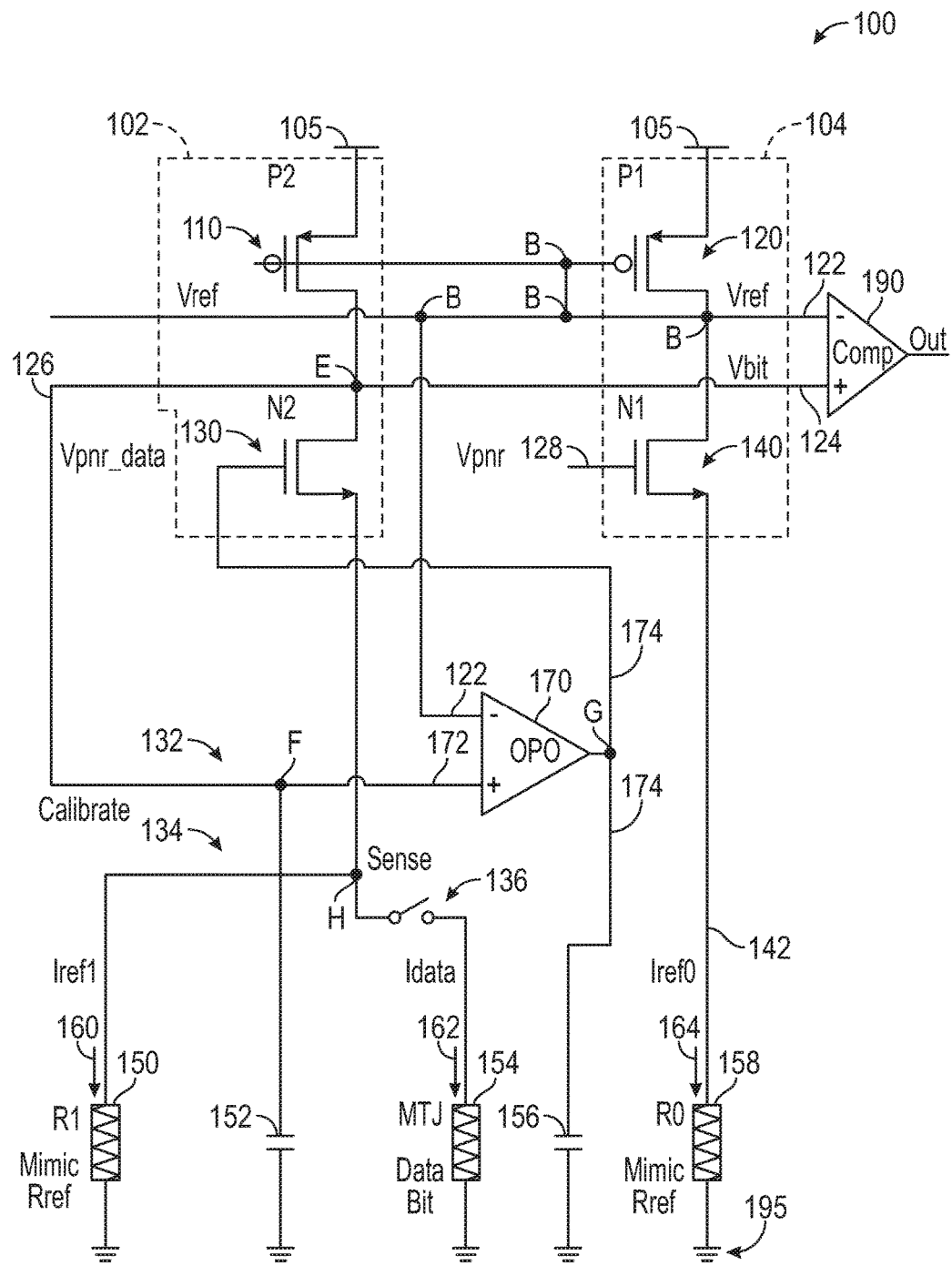
FIG. 2 is a schematic circuit diagram that illustrates the MRAM sense amplifier and the memory cell of FIG. 1 during a calibration cycle in accordance with the disclosed embodiments.
Figure 3:
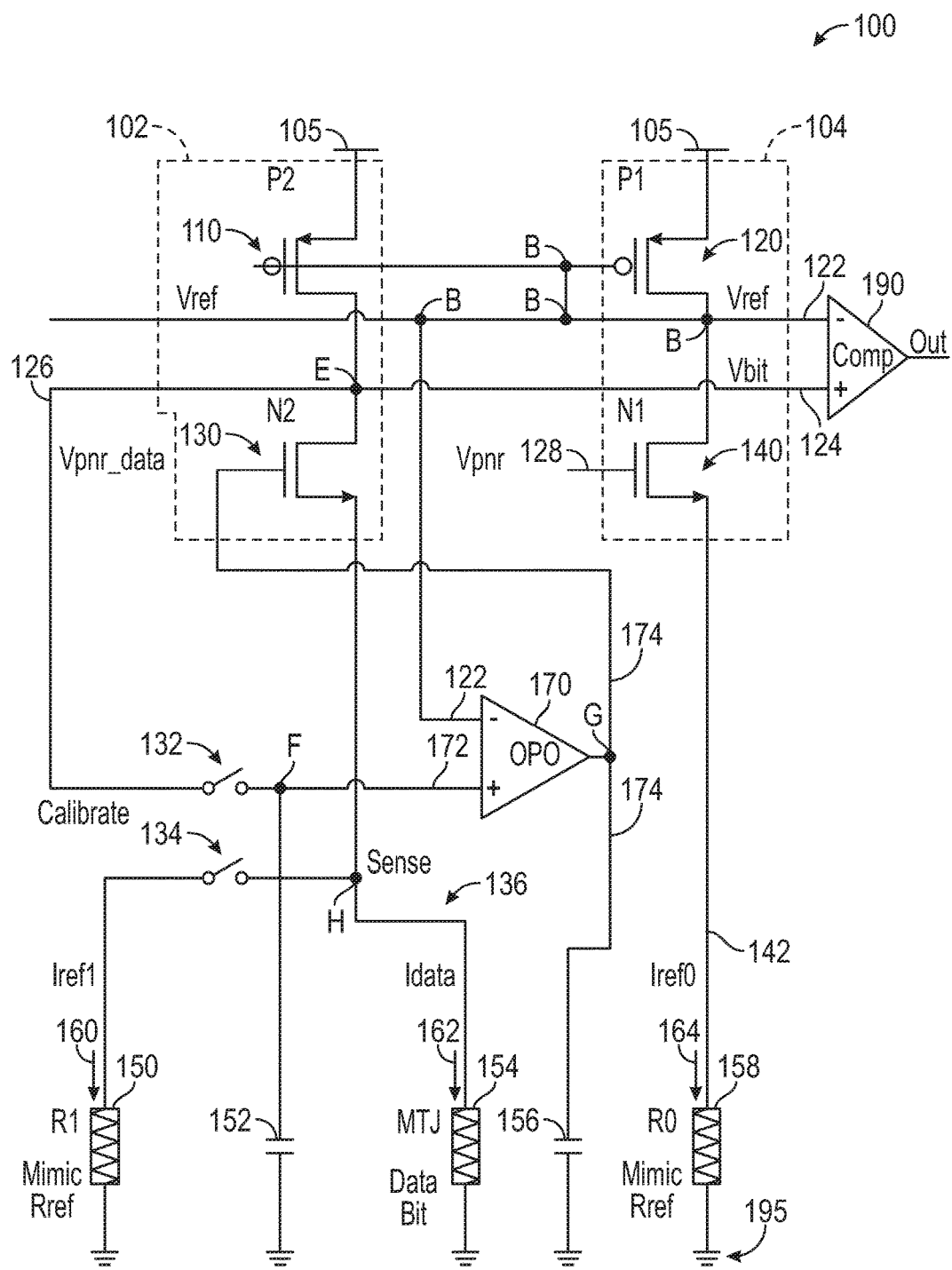
FIG. 3 is a schematic circuit diagram that illustrates the MRAM sense amplifier and the memory cell of FIG. 1 during a sensing cycle that follows the calibration cycle of FIG. 2 in accordance with the disclosed embodiments.

The pre-amplifier operates in calibration and sensing cycles that are shown in FIGS. 2 and 3 respectively.

FIG. 2 is a circuit diagram that illustrates the MRAM sense amplifier and the memory cell 154 of FIG. 1 during a calibration cycle in accordance with the disclosed embodiments. As shown in FIG. 2, during a calibration cycle (or sampling cycle), the first switch 132 and the second switch 134 are closed, and the third switch 136 is open. The first capacitor 152 is coupled between node F and ground. When the first switch 132 closes, node F is coupled to node E, and the first capacitor 152 receives the data branch output voltage (Vbit) 124 to maintain the adjusted local data bit bias voltage (Vpnr_data) 174 during a sensing cycle. During calibration cycle, the data leg 102 (that includes the first P-channel MOSFET (P2) 110 and first N-channel MOSFET (N2) 130) is switched to connect to the first reference resistance 150 to node H. The first reference resistance 150 can be implemented using any know type of resistance and in one embodiment is implemented using an MTJ cell. When the second switch 134 closes, the first reference resistance 150 is coupled to node H and receives the first reference current (Iref1) 160 output by the first N-channel MOSFET (N2) 130.

During the calibration cycle, the reference resistance 150 sensed by the data leg 102 is equal to the reference resistance 158 sensed by the reference leg 104 so that the data branch output voltage (Vbit) 124 output by the data leg 102 will be calibrated with the reference voltage (Vref) 122 output by the reference leg 104 to cancel the offset before sensing the memory cell 154. In other words, the resistances of the first reference resistance 150 and the second reference resistance 158 are equal (R0=R1), but the first reference current (Iref1) 160 is not equal to the second reference current (Iref0) 164 (Iref1≠Iref0). This is caused by first N-channel MOSFET (N2) 130 and the second N-channel MOSFET (N1) 140 or first P-channel MOSFET (P2) 110 and the second P-channel MOSFET (P1) 120 mismatch. The offset-cancellation operational amplifier 170 adjusts the local data bit bias voltage (Vpnr_data) 174 that is applied to a gate of the first N-channel transistor (N2) 130 so that the gate of the first N-channel transistor (N2) 130 clamps the voltage biased to first reference resistance 150 and memory cell 154 during the sense cycle to cancel the offset between the data branch output voltage (Vbit) 124 and the reference voltage (Vref) 122. As such, the data branch output voltage (Vbit) 124 will be the same as reference voltage (Vref) 122 when the adjusted local data bit bias voltage (Vpnr_data) 174 is applied. The first N-channel transistor (N2) 130 biases are held/stored by the second capacitor 156 for a sensing cycle that follows the calibration cycle.

FIG. 3 is a circuit diagram that illustrates the MRAM sense amplifier and the memory cell 154 of FIG. 1 during a sensing cycle that follows the calibration cycle of FIG. 2 in accordance with the disclosed embodiments. As shown in FIG. 3, during the sensing cycle the first switch 132 and the second switch 134 are open, and the third switch 136 is closed so that the data leg 102 is coupled to the memory cell 154 at the node H to allow a current (Idata) 162 to flow to the memory cell 154 to read a data bit that is held by the memory cell 154. The calibrated local data bit bias voltage (Vpnr_data) 174 is stored by the second capacitor 156 for biasing the data bit during the sensing cycle. In other words, the data leg 102 (that includes the first P-channel MOSFET (P2) 110 and first N-channel MOSFET (N2) 130) is coupled to the memory cell 154 at node H to allow the current (Idata) 162 to flow to the memory cell 154 to access and read a data bit that is held by the memory cell 154 with calibrated local data bit bias voltage (Vpnr_data) 174 that is held by the second capacitor 156.

The differential comparator 190 can then compare the data branch output voltage (Vbit) 124 to the reference voltage (Vref) 122 and output a digital signal indicating which is larger.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A magnetic random access memory (MRAM) sense amplifier circuit, comprising:
    a pre-amplifier circuit, comprising:
        a data leg comprising: a first P-channel transistor, and a first N-channel transistor configured to receive a local data bit bias voltage and to output a data branch output voltage;
        a reference leg comprising: a second P-channel transistor that mismatches the first P-channel transistor due to device variations, and a second N-channel transistor that mismatches the first N-channel transistor due to device variations, wherein the second N-channel transistor is configured to receive a global reference bit bias voltage, wherein the second P-channel transistor is configured to output a reference voltage, wherein the mismatches between the data leg and the reference leg result in a non-zero offset voltage between the local data bit bias voltage and the global reference bit bias voltage prior to calibration; and
        an operational amplifier comprising: a first input configured to receive the reference voltage; a second input configured to receive the data branch output voltage, and wherein the operational amplifier is configured to: determine a difference between the data branch output voltage and the reference voltage; and generate and output an adjusted local data bit bias voltage that matches the global reference bit bias voltage to offset the mismatches that exist between the data leg and the reference leg; and
    a differential comparator configured to compare the data branch output voltage to the reference voltage and output a digital signal indicating which is larger.

2. A circuit according to claim 1, wherein the operational amplifier is configured to:
    adjust the local data bit bias voltage to cancel an offset voltage that otherwise arises between the data branch output voltage and the reference voltage due to the mismatches when the adjusted local data bit bias voltage is applied during a sensing cycle to cancel the offset before sensing a memory cell.

3. A circuit according to claim 2, wherein applying the adjusted local data bit bias voltage causes the data branch output voltage to be the same as reference voltage even though the adjusted local data bit bias voltage and the global reference bit bias voltage are different from each other.

4. A circuit according to claim 1, wherein the first P-channel transistor comprises: a source that is coupled to a supply voltage (VDD), a gate, and a drain that is configured to receive the data branch output voltage;
    wherein the first N-channel transistor comprises: a source, a gate that is configured to receive the adjusted local data bit bias voltage output by the operational amplifier, and a drain;
    wherein the second P-channel transistor comprises: a source that is coupled to the supply voltage (VDD), a gate that is coupled to the gate of first P-channel transistor and configured to receive the reference voltage, and a drain that is configured to receive the reference voltage; and
    wherein the second N-channel transistor comprises: a source that is configured to receive the reference voltage, a gate that is configured to receive the global reference bit bias voltage, and a drain.

5. A circuit according to claim 1, wherein the reference voltage is coupled to a first node, and wherein the pre-amplifier circuit further comprises:
    a first switch configured to be coupled between a second node and a third node when closed;
    a first capacitor coupled between the third node and ground;
    a second capacitor coupled between a fourth node at an output of the operational amplifier and ground;
    a first reference resistance coupled to ground;
    a second switch configured to be coupled between a fifth node and the first reference resistance when closed;
    a third switch configured to be coupled to the fifth node when closed; and
    a second reference resistance coupled between the drain of the second N-channel transistor and ground, and being configured to receive a second reference current (Iref0) from the second N-channel transistor.

6. A circuit according to claim 5, wherein the first switch and the second switch are closed, and the third switch is open during a calibration cycle so that the first capacitor receives and stores the data branch output voltage during the calibration cycle to maintain the adjusted local data bit bias voltage during a sensing cycle,
    wherein the data leg is connected to the first reference resistance during the calibration cycle so that the first reference resistance receives a first reference current (Iref1) output by the first N-channel transistor, and wherein the first reference resistance sensed by the data leg during the calibration cycle is equal to the second reference resistance sensed by the reference leg so that the data branch output voltage output by the data leg will be calibrated with the reference voltage output by the reference leg to cancel the offset before sensing a memory cell.

7. A circuit according to claim 6, wherein the operational amplifier is configured to: adjust the local data bit bias voltage that is applied to a gate of the first N-channel transistor, during the calibration cycle, so that the gate clamps a voltage biased to first reference resistance to cancel the offset between the data branch output voltage and the reference voltage so that data branch output voltage will be the same as reference voltage when the adjusted local data bit bias voltage is applied to the first N-channel transistor and the second capacitor.

8. A circuit according to claim 7, wherein the first switch and the second switch are open and the third switch is closed during the sensing cycle so that the data leg is coupled to a memory cell at the fifth node to allow a current (Idata) to flow to the memory cell to read a data bit that is held by the memory cell.

9. A circuit according to claim 7, wherein the second capacitor is configured to store the adjusted local data bit bias voltage for a sensing cycle that follows the calibration cycle, and wherein the adjusted local data bit bias voltage is stored by the second capacitor for biasing a data bit during the sensing cycle.

10. A pre-amplifier circuit for a magnetic random access memory (MRAM) sense amplifier circuit, the pre-amplifier circuit comprising:
a data leg comprising: a first P-channel transistor, and a first N-channel transistor configured to receive a local data bit bias voltage and to output a data branch output voltage;
a reference leg comprising: a second P-channel transistor that mismatches the first P-channel transistor due to device variations, and a second N-channel transistor that mismatches the first N-channel transistor due to device variations, wherein the second N-channel transistor is configured to receive a global reference bit bias voltage, wherein the second P-channel transistor is configured to output a reference voltage, wherein the mismatches between the data leg and the reference leg result in a non-zero offset voltage between the local data bit bias voltage and the global reference bit bias voltage prior to calibration; and
an operational amplifier comprising: a first input configured to receive the reference voltage; a second input configured to receive the data branch output voltage, and wherein the operational amplifier is configured to: determine a difference between the data branch output voltage and the reference voltage; and generate and output an adjusted local data bit bias voltage that matches the global reference bit bias voltage to offset mismatches that exist between the data leg and the reference leg.

11. A circuit, comprising:
a memory cell comprising a magnetic tunnel junction (MTJ) cell;
a magnetic random access memory (MRAM) sense amplifier circuit, comprising:
a pre-amplifier circuit, comprising:
a data leg configured to receive a local data bit bias voltage and to output a data branch output voltage;
a reference leg configured to receive a global reference bit bias voltage and to output a reference voltage, wherein a device mismatch exists between the data leg and the reference leg that results in the local data bit bias voltage and the global reference bit bias voltage that are different from each other by a non-zero offset voltage prior to calibration;
an operational amplifier comprising: a first input configured to receive the reference voltage; a second input configured to receive the data branch output voltage, and wherein the operational amplifier is configured to: determine a difference between the data branch output voltage and the reference voltage; and generate and output an adjusted local data bit bias voltage that matches the global reference bit bias voltage to offset the mismatches that exist between the data leg and the reference leg; and
a differential comparator configured to compare the data branch output voltage to the reference voltage and output a digital signal indicating which is larger.

12. A circuit according to claim 11, wherein the operational amplifier is configured to:
adjust the local data bit bias voltage to cancel an offset voltage that otherwise arises between the data branch output voltage and the reference voltage due to the mismatches when the adjusted local data bit bias voltage is applied during a sensing cycle to cancel the offset before sensing the memory cell.

13. A circuit according to claim 12, wherein applying the adjusted local data bit bias voltage causes the data branch output voltage to be the same the reference voltage even though the adjusted local data bit bias voltage and the global reference bit bias voltage are different from each other.

14. A circuit according to claim 11, wherein the data leg of the pre-amplifier comprises:
a first P-channel transistor comprising: a source that is coupled to a supply voltage (VDD), a gate, and a drain that is configured to receive the data branch output voltage; and
a first N-channel transistor comprising: a source, a gate that is configured to receive the adjusted local data bit bias voltage output by the operational amplifier, and a drain; and
wherein the reference leg of the pre-amplifier, comprises:
a second P-channel transistor that mismatches the first P-channel transistor due to device variations, wherein the second P-channel transistor comprises: a source that is coupled to the supply voltage (VDD), a gate that is coupled to the gate of first P-channel transistor and configured to receive the reference voltage, and a drain that is configured to receive the reference voltage; and
a second N-channel transistor that mismatches the first N-channel transistor due to device variations, wherein the second N-channel transistor comprises: a source that is configured to receive the reference voltage, a gate that is configured to receive the global reference bit bias voltage, and a drain.

15. A circuit according to claim 11, wherein the reference voltage is coupled to a first node, and wherein the pre-amplifier circuit further comprises:
a first switch configured to be coupled between a second node and a third node when closed;

a first capacitor coupled between the third node and ground;

a second capacitor coupled between a fourth node at an output of the operational amplifier and ground;

a first reference resistance coupled to ground;

a second switch configured to be coupled between a fifth node and the first reference resistance when closed;

a third switch configured to be coupled between the fifth node and the memory cell when closed; and a second reference resistance coupled between the drain of the second N-channel transistor and ground, and being configured to receive a second reference current (Iref0) from the second N-channel transistor.

16. A circuit according to claim 15, wherein the first switch and the second switch are closed, and the third switch is open during a calibration cycle so that the first capacitor receives and stores the data branch output voltage during the calibration cycle to maintain the adjusted local data bit bias voltage during a sensing cycle, wherein the data leg is connected to the first reference resistance during the calibration cycle so that the first reference resistance receives a first reference current (Iref1) output by the first N-channel transistor, and wherein the first reference resistance sensed by the data leg during the calibration cycle is equal to the second reference resistance sensed by the reference leg so that the data branch output voltage output by the data leg will be calibrated with the reference voltage output by the reference leg to cancel the offset before sensing the memory cell.

17. A circuit according to claim 16, wherein the operational amplifier is configured to: adjust the local data bit bias voltage that is applied to a gate of the first N-channel transistor, during the calibration cycle, so that the gate clamps a voltage biased to first reference resistance and memory cell to cancel the offset between the data branch output voltage and the reference voltage so that data branch output voltage will be the same as the reference voltage when the adjusted local data bit bias voltage is applied to the first N-channel transistor and the second capacitor.

18. A circuit according to claim 17, wherein the second capacitor is configured to store the adjusted local data bit bias voltage for a sensing cycle that follows the calibration cycle.

19. A circuit according to claim 17, wherein the first switch and the second switch are open and the third switch is closed during the sensing cycle so that the data leg is coupled to the memory cell at the fifth node to allow a current (Idata) to flow to the memory cell to read a data bit that is held by the memory cell.

20. A circuit according to claim 19, wherein the adjusted local data bit bias voltage is stored by the second capacitor for biasing the data bit during the sensing cycle.

\* \* \* \* \*